(12) United States Patent
Sato et al.

(10) Patent No.: US 8,072,385 B2
(45) Date of Patent: Dec. 6, 2011

(54) CIRCUIT SUBSTRATE SUPPORTING STRUCTURE AND ANTENNA APPARATUS

(75) Inventors: Kyuichi Sato, Oga (JP); Hiroshi Suzuki, Akita (JP); Kenichi Kamada, Minamiakita-gun (JP); Takao Kato, Oga (JP)

(73) Assignee: Mitsumi Electric Co., Ltd., Tama-Shi, Tokyo (JP)

( * ) Notice: Subject to any disclaimer, the term of this patent is extended or adjusted under 35 U.S.C. 154(b) by 415 days.

(21) Appl. No.: 12/427,054

(22) Filed: Apr. 21, 2009

(65) Prior Publication Data
US 2010/0141549 A1 Jun. 10, 2010

(30) Foreign Application Priority Data
Dec. 4, 2008 (JP) .................. 2008-309590

(51) Int. Cl.
*H01Q 1/32* (2006.01)
(52) U.S. Cl. .................. 343/711; 343/715; 343/872
(58) Field of Classification Search .................. 343/711, 343/713, 715, 872
See application file for complete search history.

(56) References Cited

U.S. PATENT DOCUMENTS

| | | | |
|---|---|---|---|
| 5,451,967 A * | 9/1995 | Ueda et al. | 343/722 |
| 7,091,912 B2 * | 8/2006 | Iacovella et al. | 343/713 |
| 7,304,614 B2 * | 12/2007 | Silva et al. | 343/713 |
| 7,339,548 B2 * | 3/2008 | Cislo | 343/878 |
| 7,414,588 B2 * | 8/2008 | Tateno | 343/713 |

FOREIGN PATENT DOCUMENTS

| | | |
|---|---|---|
| JP | 6-079186 A | 11/1994 |
| JP | 2000-068722 A | 3/2000 |
| JP | 2002-94320 A | 3/2002 |

\* cited by examiner

*Primary Examiner* — Hoang V Nguyen
(74) *Attorney, Agent, or Firm* — Holtz, Holtz, Goodman & Chick, P.C.

(57) ABSTRACT

Disclosed is a circuit substrate supporting structure including: a base; a cover to cover over the base; a circuit substrate accommodated in the cover in a state standing on the base; a projecting section provided on the circuit substrate in a state projecting from a bottom edge section of the circuit substrate and placed on the base; an elastic piece placed on the projecting section; and a pressurizing section convexly provided on an inner wall of the cover above the projecting section to be pressed against the projecting section from above the elastic piece.

9 Claims, 7 Drawing Sheets

CIRCUIT SUBSTRATE SUPPORTING STRUCTURE AND ANTENNA APPARATUS

BACKGROUND OF THE INVENTION

1. Field of the Invention

The present invention relates to a circuit substrate supporting structure and an antenna apparatus, and in particular, a circuit substrate supporting structure where a circuit substrate is supported in a standing state and an antenna apparatus.

2. Description of Related Art

In an electrical apparatus such as an antenna apparatus, etc., a circuit substrate is accommodated inside a case and a circuit substrate is supported inside the case. A case main body and a base are set together as a case. The base is provided in a plate-shape and the bottom of the case main body is open to cover over the base so that the opening of the case main body is closed by the base (for example, see Japanese Patent Application Laid-Open Publication No. 2000-68722 and Japanese Patent Application Laid-Open Publication No. 2002-94320).

In order to make the apparatus smaller, the circuit substrate is accommodated in the case in a standing state with respect to the base (see Japanese Patent Application Laid-Open Publication No. 2000-68722 and Japanese Patent Application Laid-Open Publication No. 2002-94320). In order to set the circuit substrate standing with respect to the base, two ribs are convexly provided on the top face of the base, and the circuit substrate is nipped between the ribs. In order to fix the circuit substrate, the circuit substrate is nipped between the ribs and the ribs are crimped. Alternatively, another method to fix the circuit substrate is to fix the circuit substrate in a standing state to a bracket other than the base and then the bracket is fixed to the base (see Japanese Patent Application Laid-Open Publication No. 2000-68722).

However, when the rib is crimped, there is a possibility that the circuit substrate is damaged in crimping. Also, in addition to a step of setting the base to the case main body, a step to crimp the ribs is necessary and the number of steps necessary for assembly increases. When a bracket is used, in addition to a step of setting the circuit substrate to the bracket, a step to set the bracket to the base is necessary and the number of steps necessary for assembly increases.

SUMMARY OF THE INVENTION

It is, therefore, a main object of the present invention to reduce the number of steps to support the circuit substrate and to support the circuit substrate without damaging the circuit substrate.

According to an aspect of the present invention, there is provided a circuit substrate supporting structure, including:

a base;

a cover to cover over the base;

a circuit substrate accommodated in the cover in a state standing on the base;

a projecting section provided on the circuit substrate in a state projecting from a bottom edge section of the circuit substrate and placed on the base;

an elastic piece placed on the projecting section; and a pressurizing section convexly provided on an inner wall of the cover above the projecting section to be pressed against the projecting section from above the elastic piece.

According to another aspect of the present invention, there is provided an antenna apparatus, including:

a base;

a cover to cover over the base;

a circuit substrate accommodated in the cover in a state standing on the base;

a projecting section provided on the circuit substrate in a state projecting from a bottom edge section of the circuit substrate and placed on the base;

an elastic piece placed on the projecting section; and a pressurizing section convexly provided on an inner wall of the cover above the projecting section to be pressed against the projecting section from above the elastic piece.

BRIEF DESCRIPTION OF THE DRAWINGS

The above and other objects, advantages, and features of the present invention will become more fully understood from the detailed description given hereinbelow and the appended drawings which are given by way of illustration only, and thus are not intended as a definition of the limits of the present invention, wherein.

DESCRIPTION OF THE PREFERRED EMBODIMENTS

The best mode for carrying out the circuit substrate supporting structure and the antenna apparatus according to the present invention will be explained in detail with reference to the drawings. However, the scope of the invention is not limited by the illustrated examples.

Figure 1:
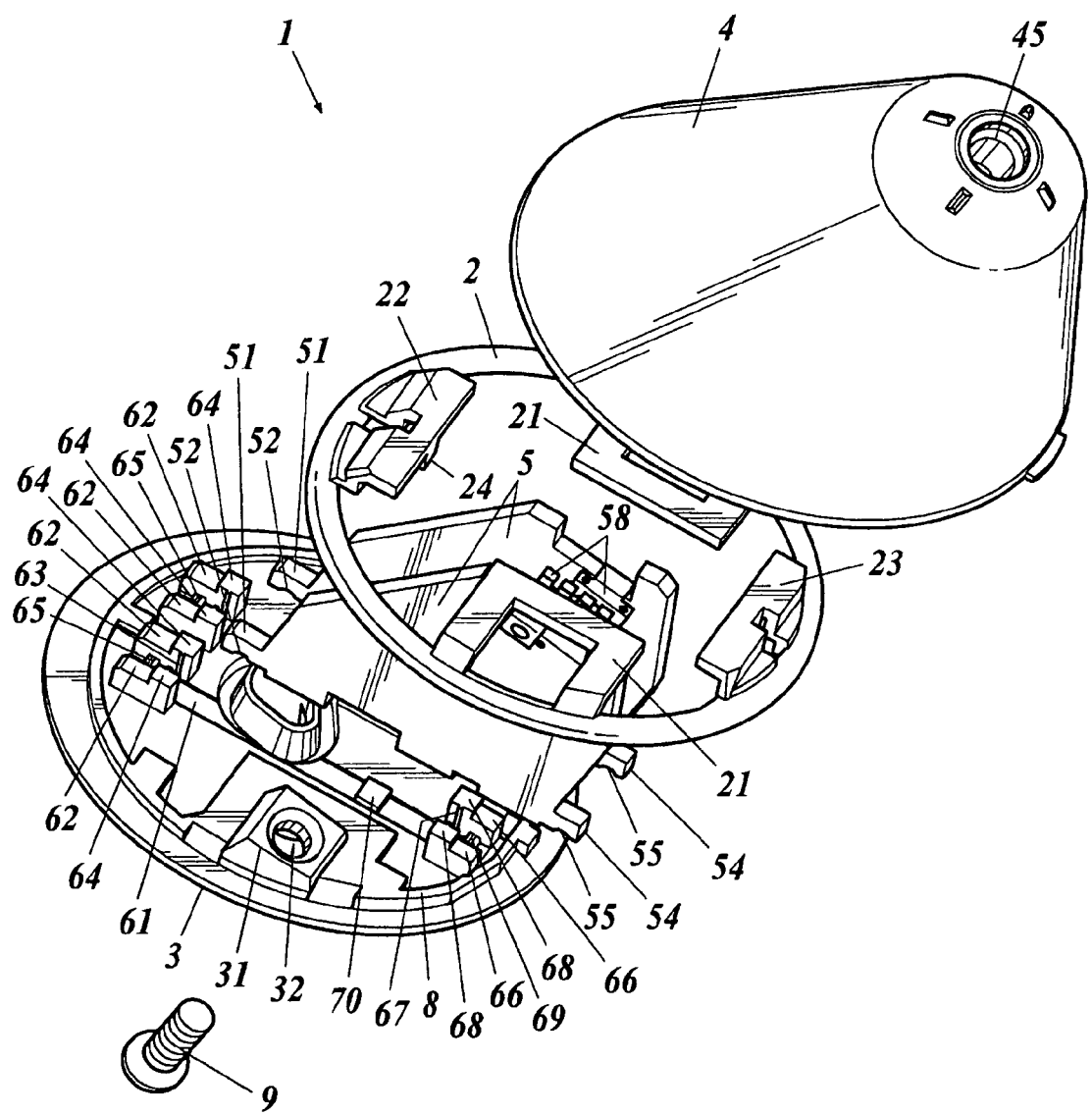
FIG. 1 is a perspective view showing an antenna apparatus of the present embodiment.
Figure 2:
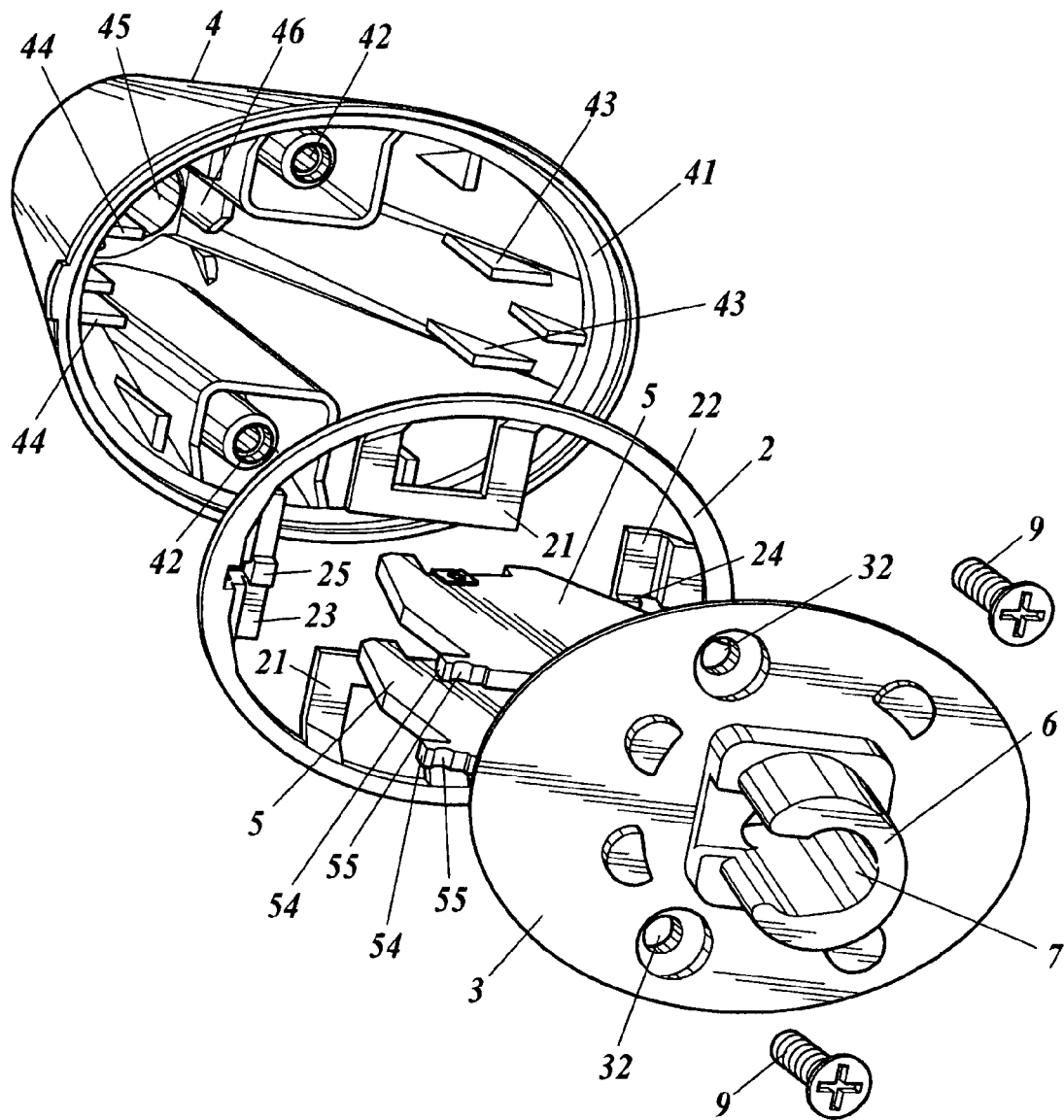
FIG. 2 is another perspective view showing the antenna apparatus of the present embodiment.
Figure 3:
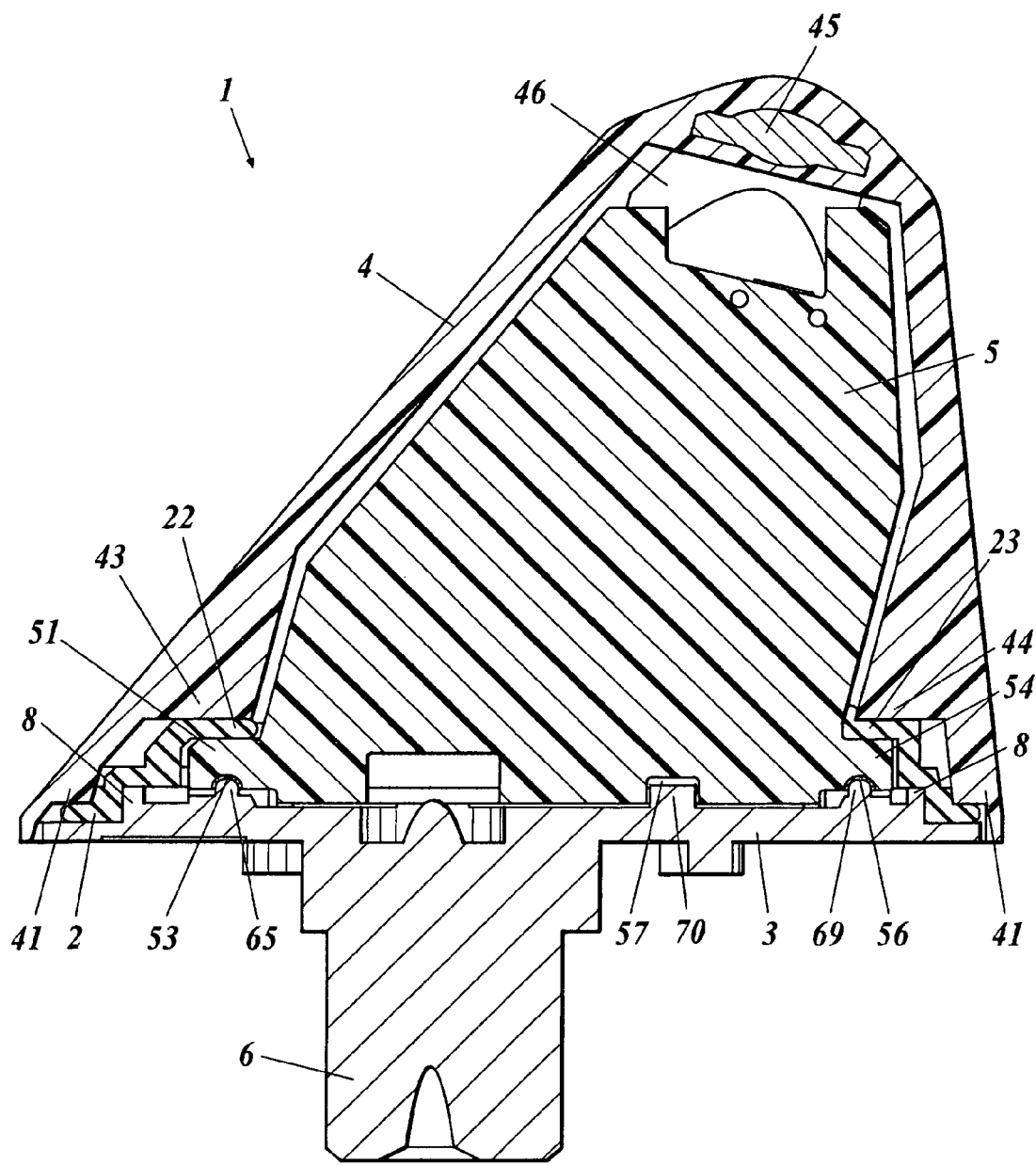
FIG. 3 is a vertical cross-sectional view showing the antenna apparatus of the present embodiment.

FIG. 1 is an exploded perspective view showing an antenna apparatus 1 from a view diagonally above, FIG. 2 is an exploded perspective view showing the antenna apparatus 1 from a view diagonally below, and FIG. 3 is a vertical cross-sectional view showing the antenna apparatus 1. The circuit substrate supporting structure of the present embodiment is applied to the antenna apparatus 1. The antenna apparatus 1 is mounted on installing points such as a roof of an automobile, a roof of a vehicle, etc.

In the antenna apparatus 1, a gasket 2 is mounted on an edge of a top face of a plate-shaped base 3, a cover 4 covers over the base 3, the rubber gasket 2 is nipped between the cover 4 and the base 3, and two circuit substrates 5 are accommodated inside the cover 4.

The base 3 is formed in an oval shape. An inserting section 6 is convexly provided on a bottom face of the base 3, and a distribution hole 7 penetrates from a tip of the inserting section 6 through a top face of the base 3. The wiring is distributed through the distribution hole 7.

A convex section 8 is provided in a convex shape on the top face of the base 3. The convex section 8 is formed in a frame shape along the edge of the top face of the base 3. On the other hand, the gasket 2 is formed in a ring shape, and the convex section 8 is fitted to the gasket 2 so that the gasket 2 surrounds the convex section 8 to be placed on the top face of the base 3.

The base 3, inserting section 6 and convex section 8 are formed integrally. The base 3, inserting section 6 and convex section 8 are made from conductive material, in particular, metallic material such as zinc.

The cover 4 is formed in a circular cone shape, and the bottom side of the cover 4 is open. A support fitting 45 is provided on the top tip section of the cover 4 and a bar-shaped antenna element is mounted to the support fitting 45.

The base 3 is fitted nesting in the opening of the cover 4 and the opening is closed by the base 3. A stepped section 41 is formed near the bottom opening in the inner wall of the cover 4. The stepped section 41 is formed in a ring shape along the bottom opening of the cover 4. The gasket 2 is nipped between the stepped section 41 and the edge section of the top face of the base 3. The gasket 2 maintains the waterproof and airproof performance.

Also, two mounts 31 are convexly provided on the top face of the base 3, and a through hole 32 penetrates from the bottom face of the base 3 to the top face of the mount 31. Two female screws 42 are formed on the inner wall of the cover 4. The female screw 42 is placed in a position corresponding to the through hole 32, and a male screw 9 is passed through the through hole 32 from below the base 3 to be screwed to the female screw 42. The cover 4 is pulled toward the top face of the base 3 by tightening the male screw 9 to compress the gasket 2.

When the base 3 is covered by the cover 4, the center line of the circular cone shaped cover 4 is diagonal with respect to the top face of the base 3, and the shaft center of the male screw 9 is almost parallel with respect to the center line of the cover 4.

A seal 21 is provided around the mount 31, and the through hole 32 is surrounded by the seal 21. The seal 21 is made of rubber, and is integrally formed to the gasket 2. Similar to the gasket 2, the seal 21 is also nipped between a part of the base 3 and a part of the cover 4, and with this, the waterproof and airproof performance around the through hole 32 is maintained. A branching circuit, amplifying circuit, etc. are included in the circuit substrate 5. One of the two circuit substrates 5 is an AM/FM substrate, and the other is a GSM substrate. The form/standard of the radio wave which can be processed by these circuit substrates 5 is not limited to AM/FM or GSM and can be other form/standard.

Figure 4:
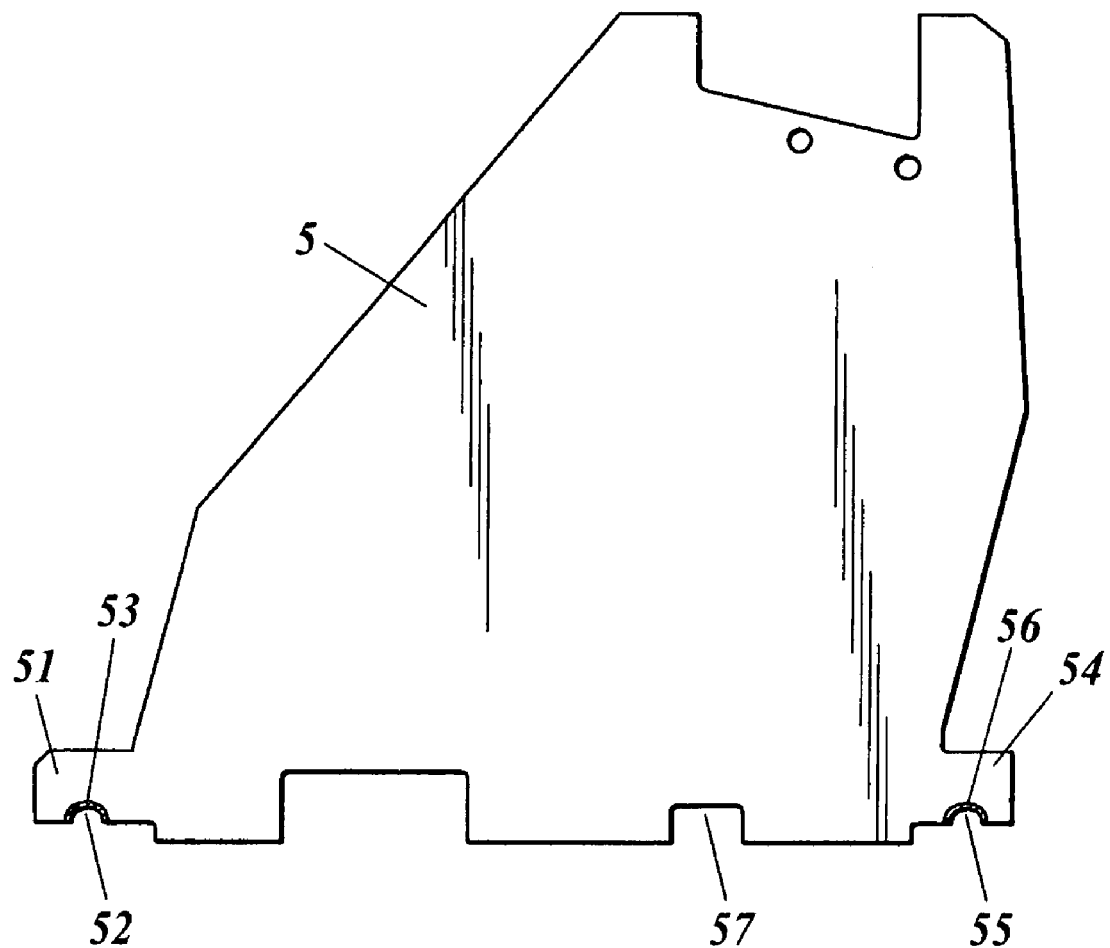
FIG. 4 is a side view showing a circuit substrate included in the above-described antenna apparatus.
Figure 5:
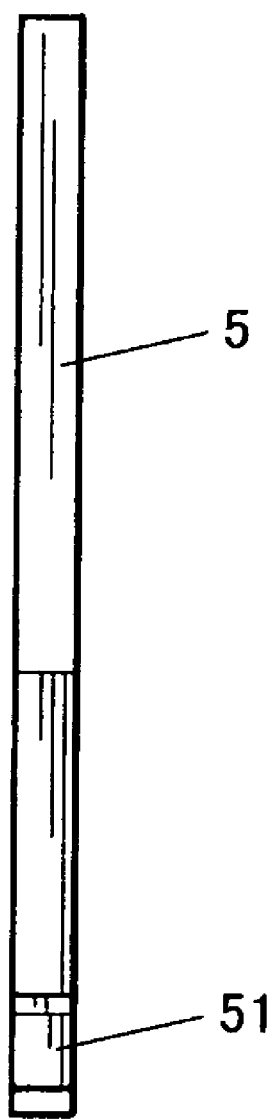
FIG. 5 is an elevation view showing the circuit substrate included in the above-described antenna apparatus.
Figure 6:
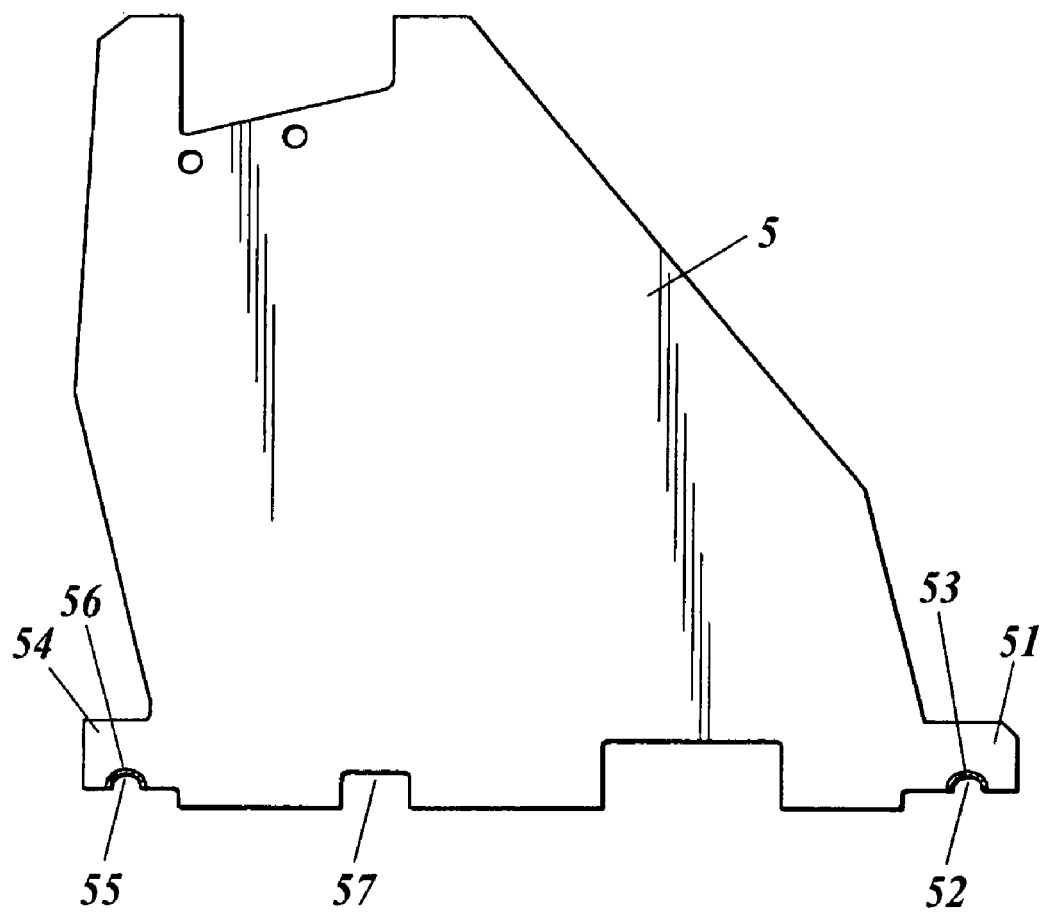
FIG. 6 is a side view showing a circuit substrate included in the above-described antenna apparatus.

Below, the circuit substrate 5 will be described in detail with reference to FIG. 4 to FIG. 6. FIG. 4 is a left side view of the circuit substrate 5, FIG. 5 is an elevation view of the circuit substrate 5 and FIG. 6 is a right side view of the circuit substrate 5.

The circuit substrate 5 is accommodated in the cover 4 in a standing state on the base 3. A rectangular notch portion 57 is formed in a center area between the front and back at the bottom edge of the circuit substrate 5. A projecting section 51 is formed at a front edge of the bottom edge section of the circuit substrate 5 and the projecting section 51 projects frontward. A concave section 52 arch-shaped from a side view is formed on a bottom face of the projecting section 51. A contact terminal 53 for grounding is formed on a basal face of the concave section 52. The contact terminal 53 is a metallic thin film such as a metalizing plating film, metallic vaporizing film, etc. and the contact terminal 53 is electrically connected to the circuit included in the circuit substrate 5. Similarly, a projecting section 54 is formed at a rear edge or the bottom edge section of the circuit substrate 5, and a concave section 55 is formed on the bottom face of the projecting section 54 and the contact terminal 56 is formed on the basal face of the concave section 55.

Figure 7:
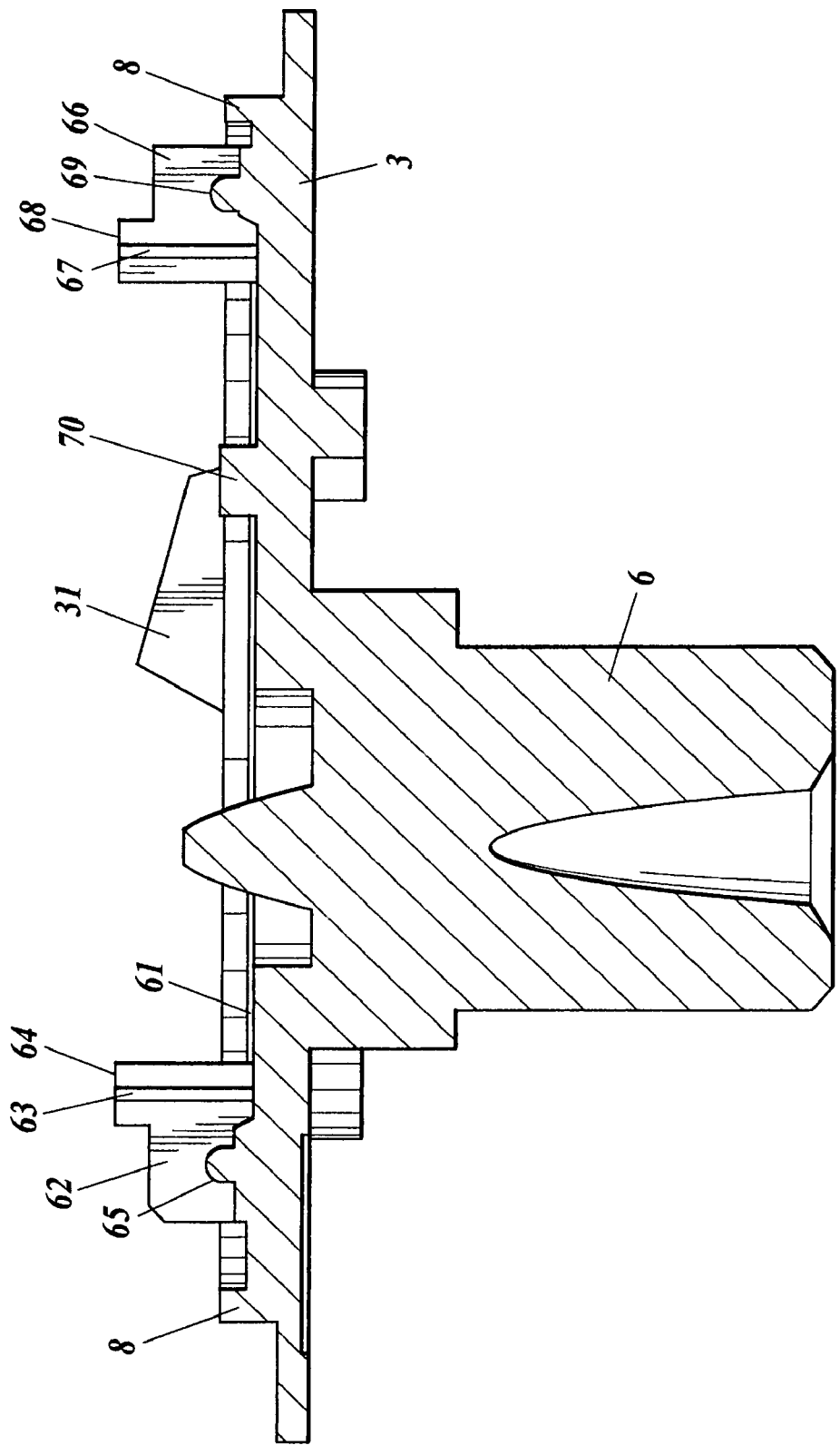
FIG. 7 is a vertical cross-sectional view showing a base included in the above-described antenna apparatus.

FIG. 7 is a vertical cross-sectional view showing the base 3. As shown in FIG. 1 to FIG. 3, FIG. 7, etc., a pair of left and right grooves 61 is formed on the top face of the base 3. These grooves 61 extend in a front and back direction and are band-shaped. The grooves 61 are below the circuit substrate 5.

A pair of left and right ribs 62 is convexly provided on each of the left and right sides of the front section of the groove 61. A boss 63 is convexly provided on the inner face of the rib 62. The boss 63 extends in a vertical direction and is formed in a thread shape. A stepped section 64 is convexly provided on the top edge of the rear section of the rib 62. A terminal 65 is convexly provided between each pair of ribs 62 on the top face of the base 3. The terminal 65 is made from conductive material, in particular, metallic material such as zinc, and is integrally formed with the base 3. A rib pair is provided by two ribs 62 for each groove 61. Thus, in total, four ribs 62 are aligned and two pairs of rib pairs are provided.

A pair of left and right ribs 66 is convexly provided on each of the left and right sides of the rear section of the groove 61. A thread-shaped boss 67 is convexly provided on the inner face of the rib 66 and a stepped section 68 is convexly provided on the top edge of the front section of the rib 66. Also, a terminal 69 is convexly provided between each pair of ribs 66 on the top face of the base 3. A rib pair is provided by two ribs 66 for each groove 61. Thus, in total, four ribs 66 are aligned and two pairs of rib pairs are provided.

A positioning projecting section 70 is convexly provided between terminal 65 and terminal 69 on the basal face of the groove 61. The positioning projecting section 70 is fitted in the notch portion 57 of the circuit substrate 5 and positions the circuit substrate 5 in the front and back direction. The circuit substrate 5 can be positioned in the front and back direction by convexly providing the positioning projecting sections in the front edge section and the rear edge section of the groove 61 so that the positioning projecting sections and tip of the projecting sections 51 and 54 are brought into contact with each other.

The projecting section 51 on the front side of the circuit substrate 5 is inserted between the left rib 62 and the right rib 62. The terminal 65 is inserted in the concave section 52 and the terminal 65 is in contact with the contact terminal 53. As for the rear side of the circuit substrate 5, the projecting section 54 is inserted between the left rib 66 and the right rib 66, and the terminal 69 is inserted in the concave section 55 and the terminal 69 is in contact with the contact terminal 56. The projecting section 51 is nipped by the left and right ribs 62 and the projecting section 54 is nipped by the left and right ribs 66 so that the circuit substrate 5 is maintained in a standing state. The terminals 65 and 69 are in contact with the contact terminals 53 and 56 so that the circuit substrate 5 is grounded.

An elastic piece 22 is placed on the projecting section 51 and the pair of ribs 62. The elastic piece 22 is provided so as to extend from the gasket 2 toward the inner side. The elastic piece 22 is made of rubber and integrally formed with the gasket 2. An elastic boss 24 is convexly provided on the bottom face of the elastic piece 22. The elastic boss 24 is also made of rubber and integrally formed with the elastic piece 22. The elastic boss 24 is inserted between two of the ribs 62 among the four aligned ribs 62. The elastic boss 24 is pressed in between the two ribs 62, and thus it is difficult to remove the gasket 2 from the base 3. The elastic boss 24 can be inserted between the left two ribs 62 among the four aligned ribs 62 or the elastic boss 24 can be inserted between the right two ribs 62 among the four aligned ribs 62.

On the opposite side of the elastic piece 22, a rubber elastic piece 23 is integrally formed with the gasket 2. The elastic piece 23 is also provided to extend from the gasket 2 toward the inner side, and the elastic piece 23 is placed on the projecting section 54 and the pair of ribs 66. An elastic boss 25 is convexly provided on the bottom face of the elastic piece 23 and the elastic boss 25 is inserted between two of the ribs 66 among the four aligned ribs 66. The elastic boss 25 can be inserted between the left two ribs 66 among the four aligned ribs 66 or the elastic boss 25 can be inserted between the right two ribs 66 among the four aligned ribs 66.

A pressurizing section 43 is provided projecting in a rib shape on the projecting section 51 at the inner wall of the cover 4. The male screw 9 is tightened to pull the cover 4 toward the base 3 so that the pressurizing section 43 is in contact with the elastic piece 22 to compress the elastic piece 22 so that the projecting section 51 is pressed to the top face of the base 3 by the pressurizing section 43. Similarly, a pressurizing section 44 is convexly provided on the projecting section 54 at the inner wall of the cover 4, and the pressurizing section 44 is in contact with the elastic piece 23 by pressurizing so that the projecting section 54 is pressed to the top face of the base 3 by the pressurizing section 44. With this, the circuit substrate 5 is supported in a standing state. Since the circuit substrate 5 is not supported by crimping, damage to the circuit substrate 5 can be prevented. Especially, since the elastic pieces 22 and 23 are nipped between the projecting sections 51 and 54 and the pressurizing sections 43 and 44, the elastic pieces 22 and 23 function as cushions to prevent damage to the circuit substrate 5 and the projecting sections 51 and 54. Also, since the elastic pieces 22 and 23 elastically deform, even if there is a dimensional error in the space between the projecting sections 51 and 54 and the pressurizing sections 43 and 44, the projecting sections 51 and 54 can be reliably pressed by the pressurizing sections 43 and 44.

By pressing the projecting section 51 to the top face of the base 3, the terminal 65 is brought into contact with the contact terminal 53 by pressurizing. The terminal 69 is also brought into contact with the contact terminal 56 by pressurizing. Therefore, by reliably bringing the terminals 65 and 69 into contact with the contact terminals 53 and 56, the grounding of the circuit substrate 5 can be reliably performed. Especially, since the groove 61 is formed below the circuit substrate 5, even if there are concaves and convexes on the top face of the base 3 or there is a dimensional error in the concave sections 52 and 55 or the terminals 65 and 69, the circuit substrate 5 is inserted in the groove 61 and the terminals 65 and 69 can be reliably brought into contact with the contact terminals 53 and 56. Since the rear edge of the compressed elastic piece 22 is in contact with the stepped section 64, the elastic piece 22 does not deform to the rear any more than this point. With this, the pressurizing force to the projecting section 51 can be even. Similarly, since the front edge of the compressed elastic piece 23 is in contact with the stepped section 68, the pressurizing force to the projecting section 54 can be even.

The top edge section of the standing circuit substrate 5 is supported by a supporting section 46 on the inner wall of the cover 4. Also, a terminal 58 is mounted to the top edge section of the circuit substrate 5, and the terminal 58 is in contact with the support fitting 45.

The method of assembly of the antenna apparatus 1 and the method of supporting the circuit substrate 5 will be described.

First, with the circuit substrate 5 held standing on the groove 61, the front and back position of the circuit substrate 5 is adjusted, and the positioning projecting section 70 is fitted into the notch portion 57 of the circuit substrate 5. At this time, the projecting section 51 is inserted between the rib 62 and rib 62, and the projecting section 54 is inserted in the rib 66 and rib 66. Since the vertically long boss 63 is convexly provided on the inner face of the rib 62, even if the space between the pair of ribs 62 is larger than the thickness of the projecting section 51, the boss 63 hits the projecting section 51 and the boss 63 is slightly compressed to support the projecting section 51. Therefore, when the space between the pair of ribs 62 is larger than the thickness of the projecting section 51, the projecting section 51 can be easily inserted in the pair of ribs 62 and also the projecting section 51 does not rattle due to the boss 63. The same can be said for the boss 67 of the rib 66.

By inserting the projecting section 51 between the pair of ribs 62, the terminal 65 is inserted in the concave section 52 to bring the terminal 65 into contact with the contact terminal 53. Also, by inserting the projecting section 54 between the pair of ribs 66, the terminal 69 is inserted in the concave section 55 to bring the terminal 69 into contact with the contact terminal 56.

Next, the convex section 8 of the base 3 is fitted to the gasket 2, and the gasket 2 is placed on the top face of the base 3 around the convex section 8. At this time, the position of the gasket 2 in the circumferential direction is adjusted to place the elastic piece 22 on the projecting section 51 and rib 62 and to place the elastic section 23 on the projecting section 54 and rib 66 to place the seal around the mount 31. With this, the projecting section and the pair of ribs 62 are covered by the elastic piece and the projecting section 54 and the pair of ribs 66 are covered by the elastic piece 23. The elastic pieces 22 and 23 are integrated with the gasket 2 and thus when the gasket 2 is set, the position of the elastic pieces 22 and 23 are also set. Therefore, the ease of assembly is enhanced.

When the elastic piece 22 is placed on the rib 62, the elastic boss 24 is fitted between the two ribs 62 and when the elastic piece 23 is placed on the rib 66, the elastic boss 25 is fitted between the two ribs 66. Since the elastic bosses 24 and 25 are fitted in a compressed state, even if the top face of the base 3 is faced down, the gasket 2, seal 21, elastic pieces 22 and 23 are not removed from the base 3. Therefore, waterproof property can be reliably obtained.

Next, the circuit substrate 5 is covered from the top with the cover 4, and the base 3 is fitted into the opening of the cover 4. With this, the gasket 2 is nipped between the stepped section 41 on the inner side of the cover 4 and the base 3, the elastic piece 22 is nipped between the projecting section 51 and the pressurizing section 43, and the elastic piece 23 is nipped between the projecting section 54 and the pressurizing section 44. Also, by fitting the base 3 into the opening of the cover 4, the top edge section of the circuit substrate 5 is supported by the supporting section 46 and the terminal 58 is in contact with the support fitting 45.

Next, the male screw 9 is passed through the through hole 32 from under the base 3 and the male screw 9 is tightened to the female screw 42. With this, the cover 4 is pulled to the top face of the base 3 and the elastic pieces 22 and 23, seal 21 and gasket 2 are compressed. The projecting sections 51 and 54 are pressed to the base 3 by the pressurizing sections 43 and 44 to fix the bottom portion of the circuit substrate 5.

Then, the antenna element is mounted to the support fitting 45 and the antenna apparatus 1 is completed.

When the antenna apparatus 1 is mounted on an installing point such as a roof of an automobile, etc., a hole section is made on the installing face to insert the inserting section 6 into the hole section to place the base 3 on the installing face and the inserting section 6 is fixed to the hole section. Since the base 3 is metallic, the circuit substrate 5 can be grounded to the installing face.

Incidentally, the present invention is not limited to the above described embodiments, and various modifications and variation in design can be performed without leaving the scope of the invention.

In the above-described embodiment, the elastic piece 22 is provided extending toward the inner side from the gasket 2. Alternatively, the elastic piece 22 can be provided so as to bridge between the left and the right of the inner side of the gasket 2. The same can be said for elastic piece 23.

Also, in the above-described embodiment, the elastic pieces 22 and 23 are integrally formed with the gasket 2, however, the elastic pieces 22 and 23 can be integrated with the gasket 2 by joining the elastic pieces 22 and 23 to the gasket 2. Also, the elastic pieces 22 and 23 can be separate from the gasket 2 and the elastic pieces 22 and 23 can be installed on the above described installing points separate from the setting of the gasket 2 when the antenna apparatus 1 is assembled.

Also, in the above-described embodiment, the base 3 is conductive. Alternatively, the base 3 can be insulated and wiring can be patterned on the top face of the base 3 to connect the wiring to the terminals 65 and 69. In this case, the contact terminals 53 and 56 do not have to be grounding terminals.

Also, in the above-described embodiment, the projecting section 51 projects frontward from the front edge of the circuit substrate 5. Alternatively, the projecting section 51 can be convexly provided on either face of the circuit substrate 5. The projecting section 54 can also be convexly provided on either face of the circuit substrate 5. The position and direction of the ribs 62 and 64, elastic pieces 22 and 23, etc., can be changed according to the position the projecting sections 51 and 54 are formed and direction the projecting sections 51 and 54 are projected.

Also, in the above-described embodiment, the male screw 9 is provided as an example of the fastening section, however, the fastening section is not limited to a screw, and can be any structure which compresses the elastic pieces 22 and 23 to connect the cover 4 and the base 3. For example, a claw provided on either the cover 4 or the base 3 can be hooked to a hook section provided on the cover 4 or the base 3 not provided with the claw so that the cover 4 is pulled to the base 3.

Also, in the above-described embodiment, the circuit substrate supporting structure applied to an antenna apparatus is described. However, the application of the circuit substrate supporting structure is not limited to an antenna apparatus and can be used in any structure including a cover and base in which a circuit substrate is accommodated inside a case.

According to an aspect of the preferred embodiments of the present invention there is provided a circuit substrate supporting structure, including:

a base;

a cover to cover over the base;

a circuit substrate accommodated in the cover in a state standing on the base;

a projecting section provided on the circuit substrate in a state projecting from a bottom edge section of the circuit substrate and placed on the base;

an elastic piece placed on the projecting section; and a pressurizing section convexly provided on an inner wall of the cover above the projecting section to be pressed against the projecting section from above the elastic piece.

According to another aspect of the preferred embodiments of the present invention there is provided an antenna apparatus, including:

a base;

a cover to cover over the base;

a circuit substrate accommodated in the cover in a state standing on the base;

a projecting section provided on the circuit substrate in a state projecting from a bottom edge section of the circuit substrate and placed on the base;

an elastic piece placed on the projecting section; and a pressurizing section convexly provided on an inner wall of the cover above the projecting section to be pressed against the projecting section from above the elastic piece.

According to these aspects, since the pressurizing section is provided on the cover, by setting the cover to the base, the pressurizing section is pressed to the projecting section from above the elastic piece, and thus the circuit substrate can be supported in a standing state. Therefore, the number of steps to support the circuit substrate can be reduced.

Also, since the circuit substrate is not supported by crimping, but rather the circuit substrate is supported by pressing by the pressurizing section, the damage to the circuit substrate can be prevented. In particular, since the elastic piece is nipped between the projecting section and the pressurizing section, the elastic piece functions as a cushion to prevent the damage to the circuit substrate and the projecting section.

Also, since the elastic piece elastically deforms by the pressing of the pressurizing section, even if there is a dimensional error between the distance of the projecting section and the pressurizing section, the projecting section is reliably pressed by the pressurizing section.

Preferably, the circuit substrate supporting structure further includes:

a concave section concavely provided on a bottom edge of the projecting section;

a conductive contact terminal formed on the concave section; and a terminal convexly provided on a top face of the base to be inserted in the concave section to be in contact with the contact terminal.

According to this aspect, since the pressurizing section is pressed to the projecting section, the terminal and contact terminal can be reliably brought into contact.

Preferably, the circuit substrate supporting structure further includes a groove formed on the top face of the base at a position below the circuit substrate along the bottom edge of the circuit substrate.

According to this aspect, since a groove is formed below the circuit substrate, even if there are concaves and convexes on the top face of the base or there is a dimensional error in the concave section or terminal, the circuit substrate is inserted in the groove to reliably bring the terminal and the contact terminal into contact with each other.

Preferably, the circuit substrate supporting structure further includes a pair of ribs convexly provided on the top face of the base and placed on both sides of the projecting section, wherein the projecting section is nipped between the pair of ribs.

According to this aspect, since the projecting section is nipped between a pair of ribs, the circuit substrate can be supported in a standing state on the base. In particular, in assembly, even before the pressurizing section is pressed against the projecting section, the circuit substrate can be supported in a standing state and the workability of assembly is enhanced.

Preferably, the circuit substrate supporting structure further includes a stepped section convexly provided on the top edge of the rib, wherein the elastic piece is placed on the rib to be in contact with the stepped section.

According to this aspect, since the elastic piece is placed on the rib to be in contact with the stepped section, even when the elastic piece is pressed by the pressurizing section, the elastic piece is not deformed along the top edge of the rib. Therefore, the force pressed on the projecting section can be even.

Preferably, the circuit substrate supporting structure further includes an elastic boss convexly provided on the elastic piece, wherein the elastic boss is fitted between the pair of ribs.

According to this aspect, since the elastic boss is fitted between the pair of ribs, the elastic piece is not misaligned from above the rib, which is effective especially in assembly.

Preferably, the circuit substrate supporting structure further includes a gasket placed on the top face of the base to surround the circuit substrate and nipped between the bottom edge section of the cover and the base, wherein the elastic piece is integrated with the gasket.

According to this aspect, the gasket maintains the waterproof and airproof performance between the base and the cover. Also, since the gasket and the elastic piece is integrally formed, when the gasket is set, the position of the elastic piece is also set, and the elastic piece can be stably and reliably placed on the projecting section and the ease of assembly is enhanced.

Preferably, the circuit substrate supporting structure further includes a fastening section to tighten the cover so that the cover is pulled to the base.

According to this aspect, since the cover is pulled to the base by the fastening section, the projecting section is pressed by the pressurizing section from above the elastic piece. Therefore, with the fastening of the fastening section, the cover can be fixed to the base and the pressing can be performed by the pressurizing section.

According to the above-described aspects, the circuit substrate can be supported without damage and the number of steps to support the circuit substrate can be reduced.

The entire disclosure of Japanese Patent Application No. 2008-309590 filed on Dec. 4, 2008 including description, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A circuit substrate supporting structure, comprising:
   a base;
   a cover to cover over the base;
   a circuit substrate accommodated in the cover in a state standing on the base;
   a projecting section provided on the circuit substrate in a state projecting from a bottom edge section of the circuit substrate and placed on the base;
   an elastic piece placed on the projecting section; and
   a pressurizing section convexly provided on an inner wall of the cover above the projecting section to be pressed against the projecting section from above the elastic piece.

2. The circuit substrate supporting structure according to claim 1, further comprising:
   a concave section concavely provided on a bottom edge of the projecting section;
   a conductive contact terminal formed on the concave section; and
   a terminal convexly provided on a top face of the base to be inserted in the concave section to be in contact with the contact terminal.

3. The circuit substrate supporting structure according to claim 2, further comprising a groove formed on the top face of the base at a position below the circuit substrate along the bottom edge of the circuit substrate.

4. The circuit substrate supporting structure according to claim 1, further comprising a pair of ribs convexly provided on the top face of the base and placed on both sides of the projecting section, wherein
   the projecting section is nipped between the pair of ribs.

5. The circuit substrate supporting structure according to claim 4, further comprising a stepped section convexly provided on the top edge of the rib, wherein
   the elastic piece is placed on the rib to be in contact with the stepped section.

6. The circuit substrate supporting structure according to claim 4, further comprising an elastic boss convexly provided on the elastic piece, wherein
   the elastic boss is fitted between the pair of ribs.

7. The circuit substrate supporting structure according to claim 1, further comprising a gasket placed on the top face of the base to surround the circuit substrate and nipped between the bottom edge section of the cover and the base, wherein
   the elastic piece is integrated with the gasket.

8. The circuit substrate supporting structure according to claim 1, further comprising a fastening section to tighten the cover so that the cover is pulled to the base.

9. An antenna apparatus comprising:
   a base;
   a cover to cover over the base;
   a circuit substrate accommodated in the cover in a state standing on the base;
   a projecting section provided on the circuit substrate in a state projecting from a bottom edge section of the circuit substrate and placed on the base;
   an elastic piece placed on the projecting section; and
   a pressurizing section convexly provided on an inner wall of the cover above the projecting section to be pressed against the projecting section from above the elastic piece.

* * * * *